United States Patent
Ohya et al.

(10) Patent No.: US 6,324,201 B1
(45) Date of Patent: Nov. 27, 2001

(54) LIGHT EMITTING SEMICONDUCTOR ELEMENT CAPABLE OF SUPPRESSING CHANGE OF DRIVING CURRENT

(75) Inventors: Masaki Ohya; Kenji Endo, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/200,060

(22) Filed: Nov. 25, 1998

(30) Foreign Application Priority Data

Nov. 28, 1997 (JP) .................................................. 9-329114
Nov. 5, 1998 (JP) ................................................. 10-314750

(51) Int. Cl.[7] ...................................................... H01S 5/20
(52) U.S. Cl. ............................................. 372/46; 372/45
(58) Field of Search ........................................ 372/45, 46

(56) References Cited

U.S. PATENT DOCUMENTS 5,694,410 * 12/1997 Motoda et al. ......................... 372/46

FOREIGN PATENT DOCUMENTS

| 815228 | 2/1996 | (JP) | .................................. H01S/3/18 |
| 8-125272 | 5/1996 | (JP) | .................................. H01S/3/18 |
| 8-139404 | 5/1996 | (JP) | .................................. H01S/3/18 |

* cited by examiner

*Primary Examiner*—James W. Davie
(74) *Attorney, Agent, or Firm*—Hayes, Soloway, Hennessey, Grossman & Hage, P.C.

(57) ABSTRACT

A light emitting semiconductor element comprises a first additive layer which is added into a cladding layer or a middle layer. The first additive layer has a lattice constant which is different from a lattice constant of a semiconductor substrate. The light emitting semiconductor element is attached to a heat sink to form a laser device. The heat sink gives deformation to the light emitting semiconductor element. The first additive layer generates strain therein and suppresses influence of the deformation.

16 Claims, 6 Drawing Sheets

LIGHT EMITTING SEMICONDUCTOR ELEMENT CAPABLE OF SUPPRESSING CHANGE OF DRIVING CURRENT

BACKGROUND OF THE INVENTION

This invention relates to a light emitting semiconductor element, and more particularly, relates to a light emitting semiconductor element such as an AlGaInp visible light emitting semiconductor laser element which is used in a light source of an optical disk system.

A conventional light emitting semiconductor laser element comprises a first conductive type substrate. A first conductive type cladding layer, an active layer, and a second conductive type cladding layer are formed on the first conductive type substrate in this order to form a double heterojunction structure. A middle layer is formed on the second conductive type cladding layer. A contact layer is ford on the middle layer. The middle layer eases an energy barrier of a valence band at boundary between the second conductive type cladding layer and the contact layer. Such a laser element is disclosed in Japanese Examined Patent Publication No. Tokyo Hei 8-15228 (or Japanese Unexamined Patent Publication JP-A No. Tokkai Sho 62-200786).

The light emitting semiconductor laser element is attached to a heat sink or a stem at high temperature to form a laser device. Since the light emitting semiconductor laser element has a heat expansion coefficient which is different from those of the heat sink and the stem, the light emitting semiconductor laser element receives stress from the heat sink or the stem at ambient temperature. The stress causes deformation in the light emitting semiconductor laser element. The deformation increases a driving current, which is used for driving the light emitting semiconductor laser element. Each light emitting semiconductor is different from other light emitting semiconductors in size of the deformation. Accordingly, the driving current is not common to all light emitting semiconductor laser elements which have the same structure. In other words, electrical characteristics of the light emitting laser elements are unequal.

SUMMARY OF THE INVENTION

It is therefore an object of this invention to provide a light emitting semiconductor laser element which substantially has an unchanging electrical characteristic before and after attachment to a heat sink or a stem.

It is another object of this invention to provide a light emitting semiconductor laser element which has a stable electrical characteristic.

It is still another object of this invention to provide a light emitting semiconductor laser element which is driven by a constant current before and after attachment to a heat sink or a stem.

It is further still another object of this invention to provide a light emitting semiconductor laser element which is driven by a lower voltage.

Other object of this invention will become clear as the description proceeds.

According to the gist of this invention, a light emitting semiconductor element comprises a semiconductor substrate which has a first conductive type and a first lattice constant. A cladding layer is used for double heterojunction which is formed on the semiconductor substrate and which has a second conductive type. A middle layer is formed on the cladding layer. A first additive layer is added into a selected one of the cladding layer and the middle layer and has a second lattice constant which is different from the first lattice constant.

DESCRIPTION OF THE PREFERRED EMBODIMENT

Referring to FIGS. 1A through 1E and 2, description will be at first directed to a conventional light emitting semiconductor element for a better understanding of this invention FIGS. 1A through 1E show steps of a manufacturing process for manufacturing a conventional AlGaInP visible light emitting semiconductor laser element. The AlGaInP visible light emitting semiconductor laser element is generally manufactured by the use of a molecular beam epitaxy (MBE) method or a metal organic vapor phase epitaxy MOVPE) method. Herein, the MOVPE method which excels in mass production is used for the manufacturing processes. The manufacturing process is described in below.

Figure 1A:
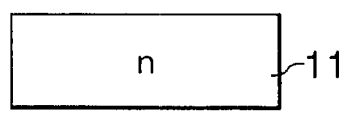
FIGS. 1A to 1E show sectional views of a conventional light emitting semiconductor laser element for use in describing steps of a manufacture process.
Figure 1B:
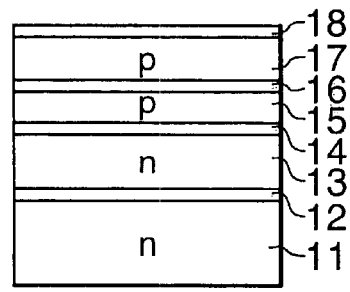

At first, an n-type semiconductor substrate 11 shown in FIG. 1A is prepared in a growth chamber (not shown) to manufacture the AlGaInP visible light emitting semiconductor laser element. The semiconductor substrate 11 has a first lattice constant.

Next, the n-type semiconductor substrate 11 is heated to 700° C. and a first epitaxy is carried out. As a result, an n-type GaAs buffer layer 12, an n-type AlGaInP cladding layer 13, an active layer 14, a p-type AlGaInP lower cladding layer 15, a etching stop layer 16, a p-type AlGaInP upper cladding layer 17, and a p-type GaInP middle layer 18 are deposited on the n-type semiconductor substrate 11 in this order. The n-type AlGaInp cladding layer 13, the active layer 14, and the p-type AlGaInP lower cladding layer 15 together form a double heterojunction structure. All deposited layers except for the active layer 14 have the same lattice constant as the first lattice constant.

Figure 1C:
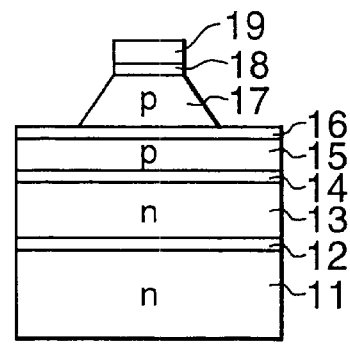

In FIG. 1C, a silicon dioxide ($SiO_2$) film 19 is deposited on the p-type GaInp middle layer 18 by a chemical vapor deposition (CVD) method and is etched to form a mask of a strips which extends along a direction from the front of the paper to the back. The p-type GaInP middle layer 18 and the P-type AlGaInP upper cladding layer 17 are etched by the use of the mask to form a stripe mesa. The etching stop layer 16 stops the etching.

Figure 1D:
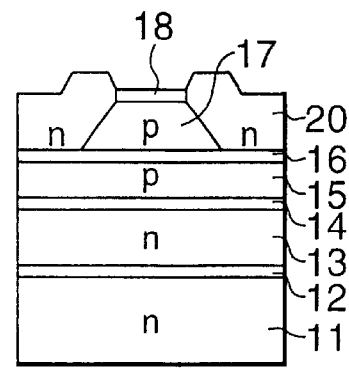

In FIG. 1D, an n-type GaAs current blocking layer 20 is selectively formed on the exposed surface of the etching stop layer 16, the p-type AlGaInP upper cladding layer 17, and the p-type GaInP middle layer 18 by a second epitaxy. The mask of the SiO$_2$ film 19 is removed after the second epitaxy.

Figure 1E:
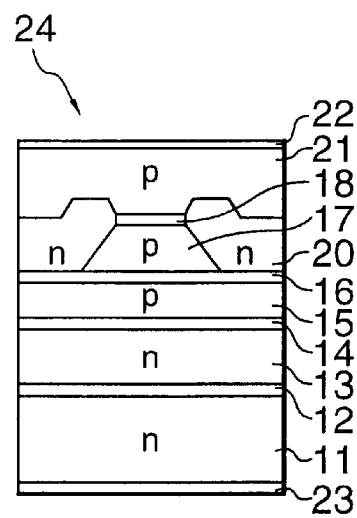

In FIG. 1E, a p-type GaAs contact layer 21 is formed on the p-type GaInP middle layer 18 and the n-type GaAs current blocking layer 20 by a third epitaxy. A p-side electrode 22 and an n-side electrode 23 are formed on an upper surface of the p-type contact layer 21 and a back surface of the n-type semiconductor substrate 11, respectively.

In this way, the AlGaInp visible light emitting semiconductor laser element 24 is completed.

In this structure, the p-GaInP middle layer 18 lowers the energy barrier of a valence band at boundary between the p-type AlGaInP upper cladding layer 17 and the p-type GaAs contact layer 19 to reduce a electric resistance. The p-type AlGaInP upper cladding layer 17 and the p-type GaInP middle layer 18 have a first energy barrier of about 200 meV at the boundary. The p-type GaInP middle layer 18 and the p-type contact layer 21 have a second energy barrier of about 300 meV the boundary. Therefore, the p-type AlGaInP upper cladding layer 17 and the p-type GaInP middle layer 18 must have high carrier densities so that the first and the second energy barrier be very thin.

Figure 2:
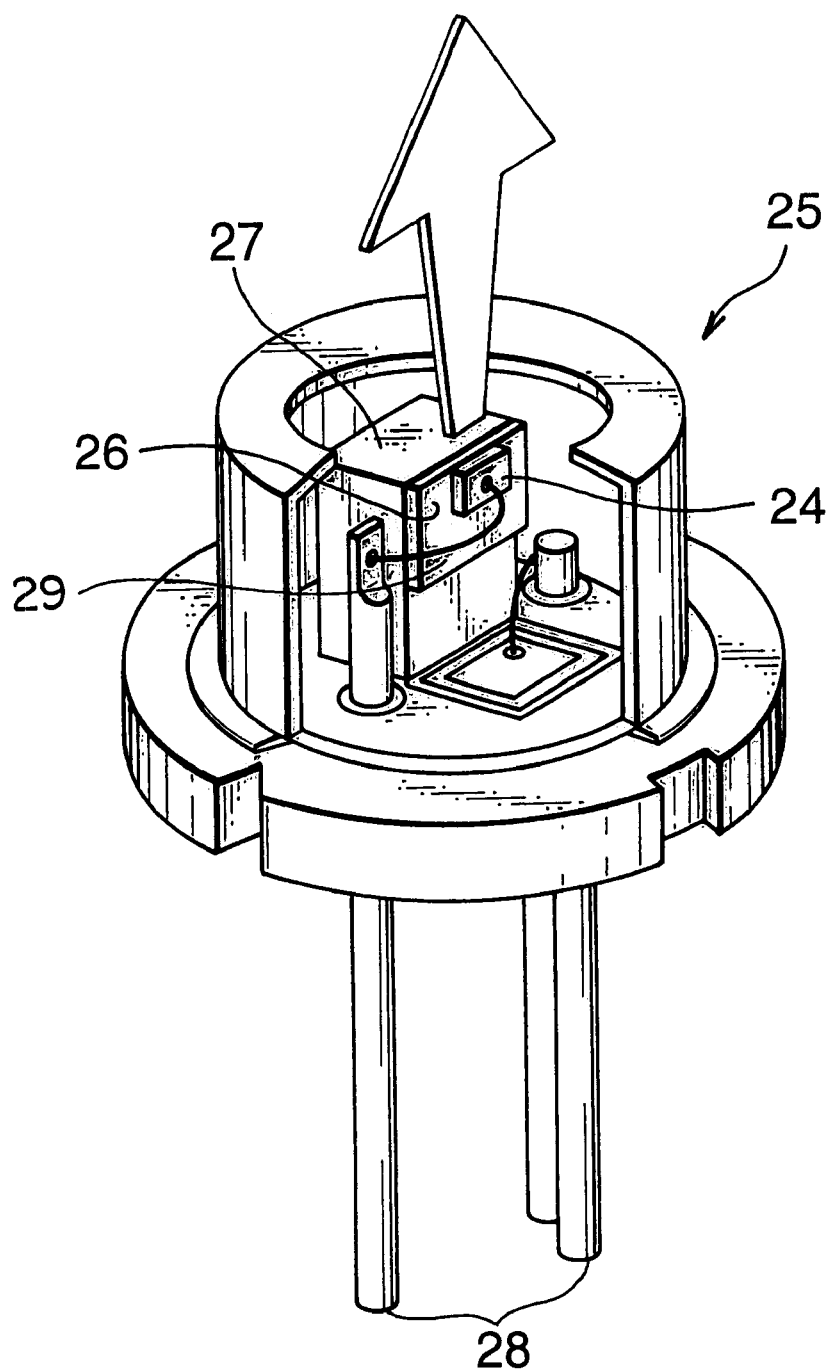
FIG. 2 shows a diagonal view of a conventional laser device including the light emitting semiconductor laser element of FIG. 1.

In FIG. 2, a laser device 25 has the AlGaInP visible light emitting semiconductor laser element 24 which is attached to a heat sink 26. The heat sink 26 is attached to a stem 27 which has terminals 28. Wires 29 connect between the AlGaInP visible light emitting semiconductor laser element 24 and the terminals 28. The AlGaInP visible light emitting semiconductor laser element 24 may be attached to the stem 27 directly without the heat sink 26.

By the way, Applicants found that a driving current of the AlGaInP visible light emitting semiconductor laser element was increased when it was assembled into the laser device. The increase of the driving current depends on the condition of the assembly into the laser device. In other words, the increase of the driving current depends on stress given by the heat sink or the stem to the AlGaInP visible light emitting semiconductor laser element. Moreover, the Applicants found that the driving current was unequally injected into the p-type GaInP middle layer and the p-type AlGaInP cladding layer along the direction of the stripe. It is supposed that the increase of the driving current is caused by the following mechanism.

The AlGaInP visible light emitting semiconductor laser element is fixed to the heat sink by fusion at about 300° C. The AlGaInP visible light emitting semiconductor laser element has a thermal expansion coefficient which is different from that of the heat sink. As a result, when temperature of the AlGaInP visible light emitting semiconductor laser element becomes normal temperature after the fusion, the AlGaInP visible light emitting semiconductor laser element suffers stress from the heat sink. The stress depends on a state of conjugation between the AlGaInP visible light emitting semiconductor laser element and the heat sink and is usually given to the p-type GaInP middle layer and the p-type AlGaInP cladding layer along the direction of the stripe. Then, the p-type GaInP middle layer and the p-type AlGaInP cladding layer have unequal deformation along the direction of the stripe.

On the other hand, it is well known that hydrogen is unfavorably taken into epitaxial layers of the light emitting semiconductor element, such as the AlGaInP visible light emitting semiconductor laser element, manufactured by the MOVPE method. The hydrogen easily dissolves combination of p-dopant and V family element to combine with the V family element. Moreover, the hydrogen taken into the epitaxial layers decreases the carrier density and the active ratio of the p-dopant. In addition, it is supposed that diffusion of the hydrogen taken into the epitaxial layers depends on size of the deformation of the epitaxial layers.

Accordingly, density of the hydrogen taken into the p-type GaInP middle layer and the p-type AlGaInP cladding layer is unequal along the direction of the stripe, when the p-type GaInP middle layer and the p-type AlGaInP cladding layer have unequal deformation along the direction of the strips as mentioned above. This means that the carrier density of the p-type GaInP middle layer and the p-type AlGaInP cladding layer is unequal along the direction of the stripe. Namely, the first and the second energy barriers are unequal along to the direction of the stripe. As a result, the driving current is unequally injected to the AlGaInP visible light emitting semiconductor laser element along to the direction of the strips and increases.

Figure 3:
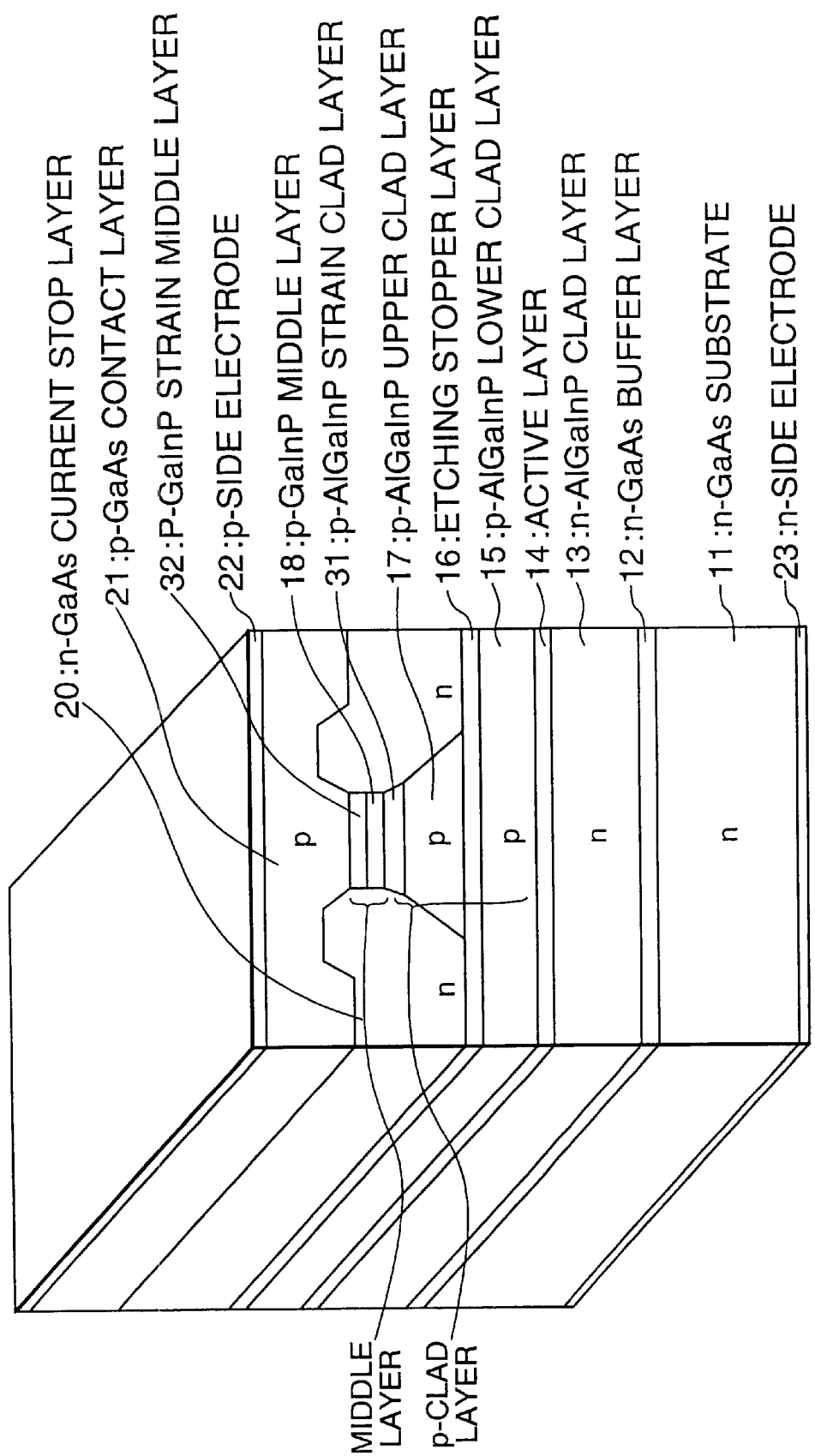
FIG. 3 shows a sectional view of a light emitting semiconductor laser element according to a first embodiment of this invention.

Referring to FIGS. 3 and 4, the description will proceed to a light emitting semiconductor element according to a first embodiment of this invention. Similar parts are designated by like reference numerals.

In FIG. 3, a light emitting semiconductor laser element is an AlGaInp visible light emitting semiconductor laser element. The AlGaInP visible light emitting semiconductor laser comprises a p-type AlGaInP strained cladding layer 31 between the p-type AlGaInP upper cladding layer 17 and the p-type GaInP middle layer 18. A p-type GaInP strained middle layer 32 is formed between the p-type GaInP middle layer 16 and the p-type GaAs contact layer 21. The p-type AlGaInP strained cladding layer 31 has a second lattice constant which is larger than the first lattice constant. Similarly, the p-type GaInP strained middle layer 32 has a third lattice constants which is larger than first lattice constant.

The p-type AlGaInP lower cladding layer 15, the etching stop layer 16, the p-type AlGaInP or cladding layer 17, and the p-type AlGaInP strained cladding layer 31 are generically named as p-type cladding layer. The p-type GaInP middle layer 18 and the p-type GaInP strained middle layer 32 are generically named as a middle layer.

FIGS. 4A through 4E show steps of a manufacturing process of the AlGaInP visible light emitting semiconductor laser element shown in FIG. 3. Epitaxy of the manufacturing process is carried by the MOVPE method at 700° C. in a decompressed chamber. In the MOVPE method, materials are trimethylindium (TMIn), trimethylaluminum (TMAl), triethylgallium (TMGa), diethylzinc (DEZn), disilane (Si$_2$H$_6$), phosphine (PH$_3$), arsine (AsH$_3$), etc.

Figure 4A:
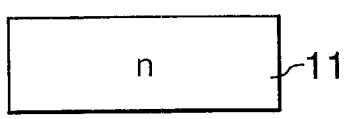
FIGS. 4A to 4E show sectional views of the light emitting semiconductor laser element of FIG. 3 for use in describing steps of a manufacturing process.

In FIG. 4A, the n-type GaAs substrate 11 is prepared to manufacture the AlGaInP visible light emitting semiconductor laser element.

Figure 4B:
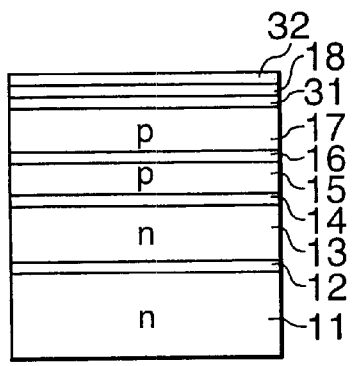

In FIG. 4B, the n-type buffer layer 12, n-type AlGaInP cladding layer 13, the active layer 14, the p-type AlGaInP lower cladding layer 15, the etching stop layer 16, the p-type AlGaInP upper cladding layer 17, the p-type AlGaInP strained cladding layer 31, the p-type GaInP middle layer 18, and the p-type GaInP strained middle layer 32 are formed on the n-type GaAs substrate by a first epitaxy in this order.

The p-type AlaGaInP strained cladding layer 31 has a first strain which is formed by the difference between the first lattice constant and the second lattice constant. The first strain is much larger than the deformation given to the AlGaInP visible light emitting semiconductor laser element by the heat sink of the laser device. If the deformation is tensile deformation, the first strain is a compressive strain. The first strain is smaller than a first limit which brings lattice defects in the p-type AlaGaInP strained cladding layer 31. Similarly, the p-type GaInP strained middle layer 32 has a second strain which is formed by the difference between the first lattice constant and the third lattice constant. The second strain is much larger than the deformation given by the heat sink. If the deformation is tensile deformation, the second strain is a compressive strain. The second strain is smaller than a second limit which brings lattice defects in the p-type GaInP strained middle layer 32.

For example, when the thermal expansion coefficient of the heat sink is about $4\times10^{-6}/°$ K and the thermal expansion coefficient of the AlGaInP visible light emitting semiconductor laser element is about $6\times10^{-6}/°$ K, the heat sink gives tensile deformation of 0.06% at a maximum to the epitaxial layers of the AlGaInP visible light emitting semiconductor laser element. Then, it is desirable that the first and the second strains are compressive strains from about 0.1% to about 0.7%.

Each of the first and the second strains is realized by change of the constitution ratio of each layer. For example, a GaInP layer matches the GaAs substrate in a lattice constant when a ratio of gallium (Ga) to indium (In) is 0.516 to 0.484 (that is nearly equal to 0.5 to 0.5). When the ratio is 0.45 to 0.55, the GaInP layer has compressive strain of 0.5%. Similarly, desirable strain is realized in an AlGaInP layer by change of a ratio of aluminum and gallium (Al+Ga) to indium (In).

The first and the second strains are uniformly distributed in crystal faces because they are formed by the MOVPE method. Namely, the first and the second strains are uniformly distributed along the direction of the strip.

It is desired that the middle layer has the highest possible carrier density without deterioration of crystal quality so as to reduce the energy barrier at the boundary between the p-type cladding layer and the p-type contact layer. It is desired that the carrier density is larger than $1\times10^{18}\text{cm}^{-3}$. Moreover, the p-type GaInP strained middle layer 32 is thinner than the critical thickness so that the crystal quality is not deteriorated. It is desired that the p-type GaInP strained middle layer 32 is smaller than 200 nm in thickness.

Figure 4C:
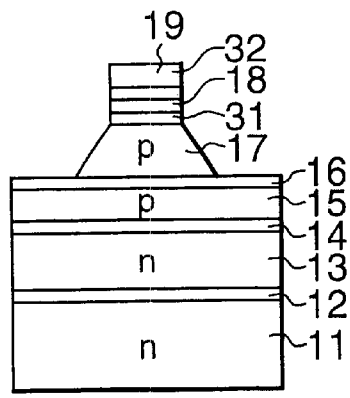

In FIG. 4C, the mask of the $SiO_2$ Film 19 is formed on the p-type GaInP strained middle layer 32. The-types GaInP strained middle layer 32, the p-type GaInP middle layer 18, the p-type AlGaInP strained cladding layer 31, and p-type AlGaInP upper cladding layer 17 art partially etched by etchant of $H_2SO_4$ system to form the stripe mesa.

Figure 4D:
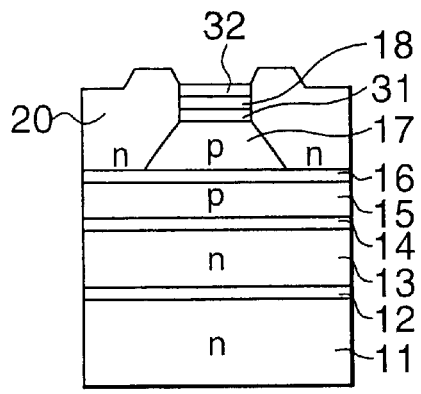

In FIG. 4D, the mask is removed to expose the p-type GaInP strained middle layer 32 after the n-type GaAs current blocking layer 20 is selectively formed on the exposed surface except for the mask by the second epitaxy.

Figure 4E:
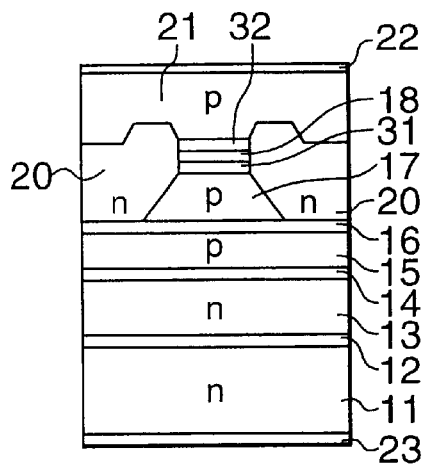

In FIG. 4E, the p-type GaAs contact layer 21 is formed on the n-type GaAs current blocking layer 20 and the p-type GaInP strained middle layer 32 by the third epitaxy. The p-side electrode 22 is formed on the p-type GaAs contact layer 21 and the n-side electrode 23 is formed on the back surface of the n-type GaAs substrate 11.

The AlGaInP visible light emitting semiconductor laser element shown in FIG. 4E is fixed to the heat sink (see FIG. 2) by the fusion at about 300° C. The heat sink is attached to the metal stem by the fusion. Therefore, the laser device is completed.

In this structure of th laser device, the first and the second strains are much larger than the deformation given by the heat Sink and are uniformly along the direction of the stripe.

Thus, the first and the second strains inhibit the deformation unequally given by the heat sink. As a result, the driving current practically is a constant before and after the attachment to the laser device. Namely, the laser device has good electrical characteristics. In addition, when the first and the second strains are compressive strains, they ease the first and the second energy barriers of the valence band at the boundaries between the p-type AlGaInP upper cladding layer 17 and the p-type GaInp middle layer 18 and between p-type GaInP middle layer 18 and the p-type GaAs contact layer 21.

Though the p-type AlGaInP strained cladding layer 31 has the first strain which is uniform in a thickness direction in the above description, the first strain may be changed in the thickness direction. It is enough that the p-type cladding layer has large strain at a side of the middle layer to obtain effects of this invention. Similarly, the p-type GaInP strained middle layer 32 has the second strain which is uniform in the thickness direction in above description, the second strain may be changed in the thickness direction. It in enough that the middle layer has large strain at a side of the p-type GaAs contact layer 21 to obtain effects of this invention.

There is a case that easiness of a carrier flow is decided by one of the first and the second energy barriers. This is because the first and the second energy barriers are determined by the carrier densities of the p-type cladding layer, the middle layer, and the p-type GaAs contact layer 21. In such a case, the p-type AlGaInP strained cladding layer 31 or the p-type GaInP middle layer 32 is not always necessary.

The p-type GaInP middle layer 32 is not always close to the p-type GaAs contact layer 21. For example, the p-type GaInP middle layer 32 may be between the p-type GaInP middle layer 18 and p-type GaInP strained cladding layer 31. Moreover, the p-type GaInP middle layer 32 may be in the p-type GaInP middle layer 18.

The p-type GaInP strained middle layer 32 sakes possible omission of the p-GaInP middle layer 18. In other words, the middle layer may include the p-type GaInP strained middle layer 32 only. The middle layer may be a p-type AlGaIn middle layer (not shown) instead of p-type GaInP strained middle layer 32. In this case, the p-type AlGaInP middle layer must be lower than the p-type AlGaInP upper cladding layer 17 in constitution ratio of aluminum. The constitution ratio of aluminum may be change in the thickness direction so as to decrease from a side of the p-type AlGaInP strained cladding layer 31 to a side of the p-type GaAs contact layer 21. A ratio of aluminum to gallium determines a band gap of the AlGaInP layer and hardly determines its lattice constant. The lattice constant of the AlGaInP layer almost depends on a ratio of aluminum and gallium to indium.

A p-type AlGaInP middle layer may be used for the p-type GaInP middle layer 18. In this case, a constitution ratio of aluminum of the p-type AlGaInP middle layer may be changed in the thickness direction so as to decrease from a side of the p-type AlGaInP strained cladding layer 31 to a side of the p-type GaAs contact layer 21.

The p-type GaAs contact layer 21 may be formed by two steps. At a first step, a first p-type a contact layer is deposited on the p-type GaInP middle layer 32 after the first epitaxy illustrated in FIG. 4B. Then, the same process as illustrated in FIGS. 4C to 4E is carried out. Namely, a second p-type GaAs contact layer is formed by the third epitaxy which corresponds to a second step. In this case, the p-type GaInp strained middle layer 32 is more effective because it is not exposed to the atmosphere between the first epitaxy and the second epitaxy and protected from thermal damage at the third epitaxy.

Figure 5:
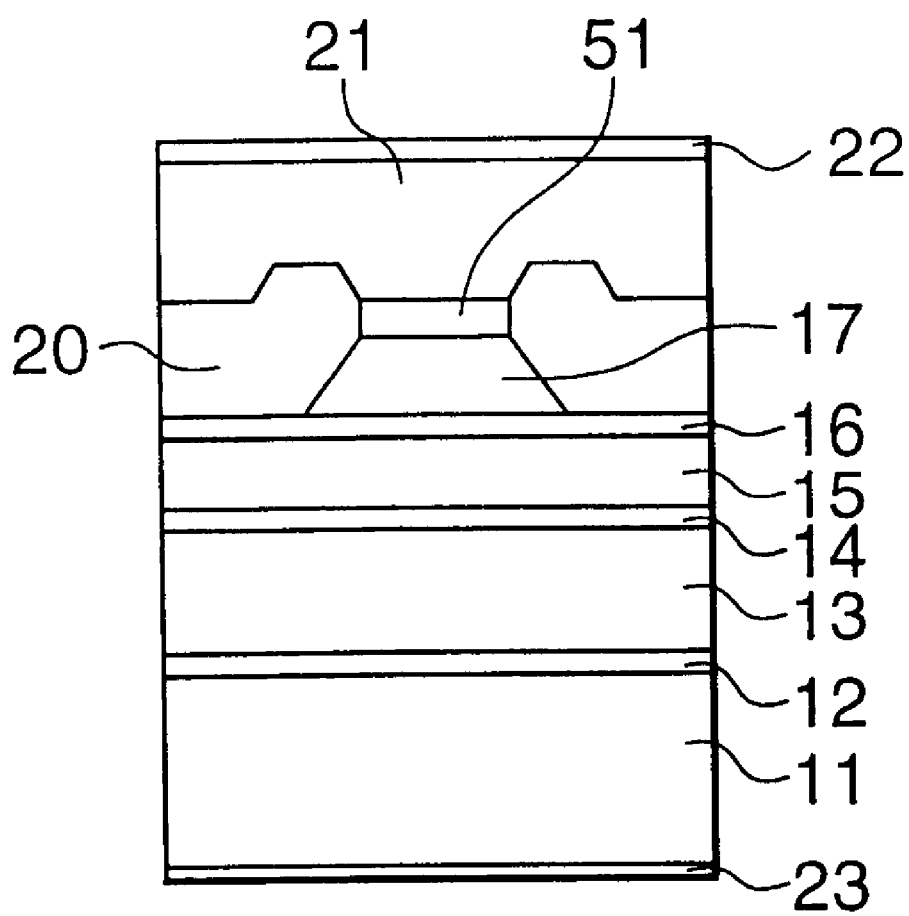
FIG. 5 shows a sectional view of a light emitting semiconductor laser element according to a second embodiment of this invention.

Referring to FIG. 5, the description will be made about a light emitting semiconductor element according to a second embodiment of this invention.

Figure 6:
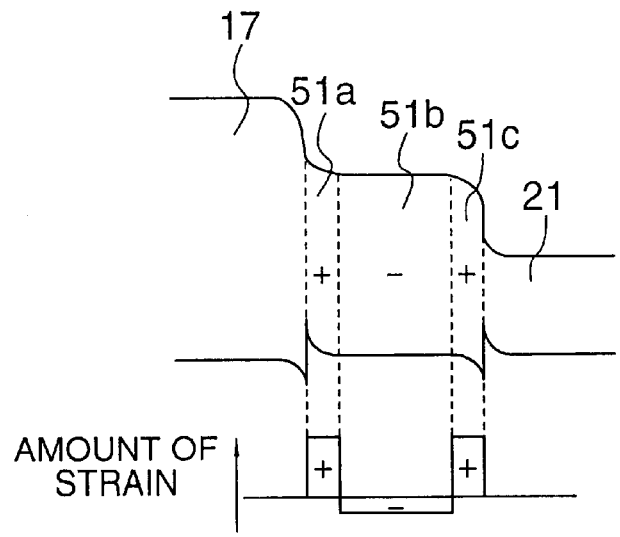
FIG. 6 shows a band structure of the light emitting semiconductor laser element of FIG. 5.

In FIG. 5, the light emitting semiconductor element has a p-type GaInP strain compensated middle layer 51 between the p-type AlGaInP cladding layer 17 and the p-type GaAs contact layer 21. The p-type GaInP strain compensated middle layer 51 consists of a first compressive strained layer 51a, a tensile strained layer 51b, and a second compressive strained layer 51c so as to have a band structure shown in FIG. 6. The band structure is called a strain compensated type. The first and the second compressive strained layers 51a and 51c can have larger compressive strain in comparison with a case that a single compressive strained layer is used for the p-type GaInP strain compensated middle layer 51. This is because the tensile strained layer 51b is between the first and the second compressive strained layers 51a and 51c. The first and the second compressive strained layer 51a and 51c have lattice constants which are larger than the first lattice constant. The tensile strained layer 51b has a fourth lattice constant which is smaller than the first lattice constant. Therefore, even if the p-type GaInP strain compensated middle layer 51 receives unexpected large stress from the heat sink, it restrains influence of the stress.

Though the middle layer is the p-type an strain compensated middle layer 51 which has three strained layers 51a, 51b, and 51c, it may has two strained layers which have compressive strain and tensile strain, respectively. The light emitting semiconductor element may have the p-type AlGaInP cladding layer 31 and the p-GaInP middle layer 18. The p-type GaInP strain compensated middle layer 51 may have strain which is changed in the thickness direction. Similarly, the p-GaInP middle layer 18 may have strain which is changed in the thickness direction. The middle layer may be made of AlGaInP. In this case, a constitution ratio of aluminum may be changed in the thickness direction in the middle layer.

Figure 7:
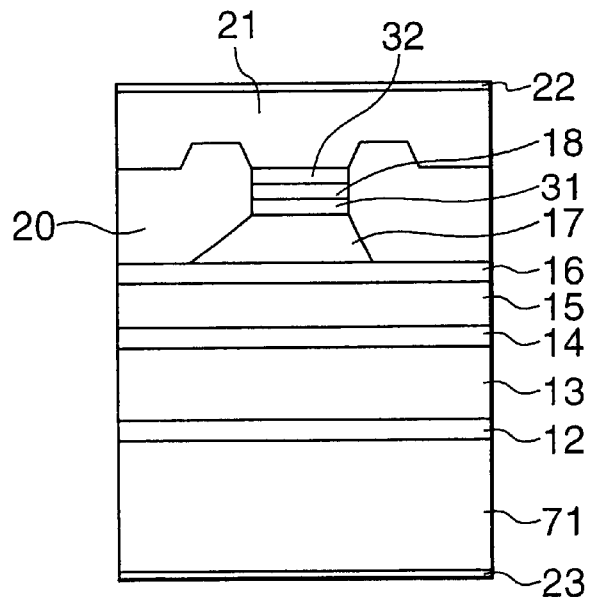
FIG. 7 shows a sectional view of a light emitting semiconductor laser element according to a third embodiment of this invention.

Referring to FIG. 7, the description will be made about a light emitting semiconductor element according to a third embodiment of this invention.

In FIG. 7, the light emitting semiconductor element has an incline substrate 71 having a surface that is inclined over 2 degrees from a (0 0 1) crystal face. The incline substrate 71 is, for example, a (1 1 5)A n-type Gas substrate which has a surface inclined at 15.8 degrees from the (0 0 1) crystal face toward th [1 1 0] direction.

Generally, band gaps of GaInP and AlGaInP formed on the incline substrate 71 by the MOVPE method are larger than those of GaInP and AlGaInP formed on a non-incline substrate. Accordingly, it is easily obtained that a laser element has a short emitting wavelength of 650 nm by the use of the incline substrate. However, the incline substrate 71 increases band discontinuity between the p-type AlGaInP upper cladding layer 17 and the p-type GaAs contact layer 21. This makes remarkable for unequally of the driving current injected to the light emitting semiconductor element in the direction of the stripe. According to this embodiment, the driving current is uniformly injected to the light emitting semiconductor device having the incline substrate 71 because the p-type AlGaInP strained cladding layer 31 and the p-type GaInP strained middle layer 32 suppress the influence of the unequal deformation given by the heat sink. As a result, the light emitting semiconductor device has a stable characteristic.

The p-type AlGaInP strained cladding layer 31 and the p-type GaInP strained middle layer 32 may be replaced with the p-type strain compensated GaInP middle layer 16 of the second embodiment.

While this invention has thus far been described in conjunction with preferred embodiments thereof, it will readily be possible for those skilled in the art to put this invention into practice in various other manners. For example, the growth method may be the MBE method.

According to this invention, the driving current does not increase after the attachment for the laser device. As a result, the laser device can operate at high temperature and reliability of the operation is improved.

In addition, operating voltage and electricity consumption are reduced because the energy barrier is reduced and the carrier easily moves in the laser device.

What is claimed is:

1. A light emitting semiconductor element comprising:
    a semiconductor substrate having a first conductive type and a first lattice constant;
    a first cladding layer having said first conductive type formed on said semiconductor substrate;
    an active layer formed on said first cladding layer;
    a second cladding layer having a second conductive type formed on said active layer;
    a contact layer;
    a middle layer having a function as a buffer between said second layer and said contact layer; and
    an added strained layer formed on said second cladding layer or on said middle layer and having a second lattice constant different from said first lattice constant.

2. A light emitting semiconductor element claimed in claim 1, wherein said added strained layer is formed on said middle layer.

3. A light emitting semiconductor element claimed in claim 1, wherein said light emitting semiconductor element further comprises a contact layer formed on said middle layer, and wherein said added cladding layer is formed on said middle layer adjacent to said contact layer.

4. A light emitting semiconductor element claimed in claim 1, wherein said light emitting semiconductor element further comprises a contact layer formed on said middle layer wherein said added strained layer is formed on said middle layer spaced apart from both said cladding layer and said contact layer.

5. A light emitting semiconductor element claimed in claim 1, wherein said second lattice constant is larger than the first lattice constant.

6. A light emitting semiconductor element claimed in claim 1, wherein said second lattice constant changes from the first lattice constant to a predetermined lattice constant which is larger than the first lattice constant.

7. A light emitting semiconductor element claimed in claim 1, wherein said light emitting semiconductor element is attached to a heat sink to form a semiconductor laser device, and wherein said added strained layer generates a strain which is larger than a deformation produced by said heat sink.

8. A light emitting semiconductor element claimed in claim 1, wherein said added strained layer is formed on said cladding layer, and wherein a second added strained layer is formed on said middle layer having a third lattice constant different from said first lattice constant.

9. A light emitting semiconductor element claimed in claim 8, wherein said added strained layer is formed adjacent said middle layer.

10. A light emitting semiconductor element claimed in claim 8, wherein said light emitting semiconductor element further comprises a contact layer formed on said middle layer, wherein said second added strained layer is close to said contact layer.

11. A light emitting semiconductor element claimed in claim 8, wherein said second lattice constant and said third lattice constant are larger than the first lattice constant.

12. A light emitting semiconductor element claimed in claim 1, and further comprising a second added strained layer formed on said middle layer adjacent said added strained layer and having a fourth lattice constant which is smaller than the first lattice constant.

13. A light emitting semiconductor element claimed in claim 1, wherein said semiconductor substrate has a surface which is inclined 2 degrees or over from a (001) crystal face.

14. A light emitting semiconductor element claimed in claim 1, wherein said middle layer has carrier density over $1 \times 10^{18} cm^{-3}$, and said first added strained layer has a thickness under 200 nm.

15. A light emitting semiconductor element claimed in claim 1, wherein said semiconductor substrate comprises a GaAs substrate, and includes a GaInP layer and a AlGaInP layer, and said middle layer comprises a GaInP layer or an AlGaInP layer, wherein said light emitting semiconductor element further comprises a contact layer which is a GaAs layer formed on said middle layer.

16. A light emitting semiconductor element comprising:

a semiconductor substrate having a first conductive type and a first lattice constant;

a first cladding layer having said first conductive type formed on said semiconductor substrate;

an active layer formed on said first cladding layer;

a second cladding layer having a second conductive type formed on said active layer;

a contact layer;

a middle layer having a function as a buffer between said second cladding layer and said contact layer; and an added strained layer formed on said second cladding layer or on said middle layer and having a second lattice constant different from said first lattice constant, wherein said first additive layer forms said second cladding layer or said middle layer.

* * * * *